United States Patent
Cerio, Jr.

(10) Patent No.: US 6,268,284 B1
(45) Date of Patent: Jul. 31, 2001

(54) IN SITU TITANIUM ALUMINIDE DEPOSIT IN HIGH ASPECT RATIO FEATURES

(75) Inventor: Frank M. Cerio, Jr., Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/167,363

(22) Filed: Oct. 7, 1998

(51) Int. Cl.$^7$ .................................................. H01L 21/44
(52) U.S. Cl. ......................... 438/643; 438/644; 438/658
(58) Field of Search .................................. 438/597, 636, 438/643, 653, 654, 658, 644, 688, 648

(56) References Cited

U.S. PATENT DOCUMENTS

| | | | |
|---|---|---|---|
| 4,963,240 | * 10/1990 | Fukasawa et al. | 204/192.15 |
| 5,178,739 | 1/1993 | Barnes et al. | 204/192.12 |
| 5,569,363 | 10/1996 | Bayer et al. | 204/192.32 |
| 5,700,718 | 12/1997 | McTeer | 437/192 |
| 5,863,398 | * 1/1999 | Kardokus et al. | 204/298.13 |

FOREIGN PATENT DOCUMENTS

| | | | |
|---|---|---|---|
| 0 107 7933 | 3/1989 | (EP) | H01L/21/28 |
| 0 524 754 A2 | 7/1992 | (EP) | H01L/23/532 |
| 0 551 117 A2 | 1/1993 | (EP) | H01L/21/90 |
| 0 725 439 A2 | 8/1993 | (EP) | H01L/23/532 |
| 0 799 903 A2 | 8/1996 | (EP) | C23C/14/14 |
| 788145 | * 2/1997 | (EP) | . |
| 0 788 145 A2 | 2/1997 | (EP) | H01L/21/285 |
| 05117848 | * 5/1993 | (JP) | . |
| 9311112 | * 11/1993 | (KR) | . |

OTHER PUBLICATIONS

J. K. Howard, et al. IBM Tech. Discl. Bull. vol. 23, No. 7B, pp. 3224–3226.(Dec. 1980).*

* cited by examiner

*Primary Examiner*—Caridad Everhart
(74) *Attorney, Agent, or Firm*—Wood, Herron & Evans, LLP

(57) ABSTRACT

A method to deposit a composite metal to form a continuous, smooth film in high aspect ratio features such as vias, contacts and/or trenches on a wafer in a single step. Metal atoms are sputtered from a composite target containing a first metal and a second metal in a single reaction chamber. A physical vapor deposition processes such as ionized physical vapor deposition (IPVD) is preferred. In one embodiment, the first metal is titanium and the second metal is aluminum. The method eliminates a high temperature anneal and results in lower resistivity, a better wetting layer for subsequent deposition and improved control over thickness of the metal layer.

24 Claims, 2 Drawing Sheets

IN SITU TITANIUM ALUMINIDE DEPOSIT IN HIGH ASPECT RATIO FEATURES

FIELD OF THE INVENTION

The invention relates generally to the formation of an integrated circuit in a semiconductor substrate, and more specifically to enhancement of interconnect reliability by a method of filling high aspect ratio features of a contact or via.

BACKGROUND

As the demand increases for substrates or wafers to contain more and more devices, the number of interconnects in a substrate must increase. With complex integrated circuits, many oxide layers are deposited and more stacks are layered over the silicon base, forming interlevel stacks. Vias can be cut into these multilayered structures to permit interconnections between levels. These interlevel vias typically have a depth-to-width ratio greater than one and are termed high aspect ratio vias.

High aspect ratio features in vias or contacts permit a greater number of interlevel interconnects, but their depth makes it difficult to fill the via. For efficient interconnections between vias, the film deposited in the via must completely and uniformly coat both the bottom and sidewalls and must completely fill the via. Thus, the ability of a film to uniformly coat, form contact plugs and completely fill interlevel vias is important to the integrity and efficiency of the integrated circuit.

Typically, a metal layer of titanium (Ti) is first deposited into the via, followed by depositing a metal such as aluminum (Al) to fill the via. The Ti layer, ideally about 100 Å but usually in the range of about 300 Å to about 500 Å, serves as a wetting layer or seed layer for the subsequent Al or other metal deposition. The Ti layer also serves as a diffusion barrier to keep the metal in the metal oxide layer from diffusing into the silicon layer at the contact.

Al contact plugs require a barrier, usually titanium nitride (TiN) or titanium tungsten (TiW), and a wetting layer or seed layer of Ti. The TiN barrier is fortified by annealing, using either a furnace anneal or a reflow 20 module, to pack grain boundaries of the TiN to prevent electromigration. Al via plugs require only a seed or wetting layer such as Ti prior to a fill step.

The fill step can be by a "reflow", "two-step", "three-step", Forcefill, or chemical vapor deposition (CVD), for example a plasma enhanced chemical vapor deposition (PECVD), process. The fill steps occur at an elevated temperature (>350° C.) allowing $TiAl_3$ to form in the reaction $Ti+3Al \rightarrow TiAl_3$.

While TiN can also act as a wetting layer, Ti is more desirable since TiN reacts with Al at higher temperatures. Additionally many subsequent anneals can form AlN, which is insulating. TiN is also thermodynamically unstable with respect to Al. However, Ti too has disadvantages as a wetting layer. A clean Ti surface, which is required for Al fill, reacts with Al when heated above 350° C. and forms $TiAl_3$. The change in volume from $TiAl_3$ induces the problem of stress-related voiding. $TiAl_3$ is also much more resistive than Al, resulting in a net increase in the line resistance.

A minimum amount of Ti is required to provide continuous sidewall and bottom coverage of high aspect ratio features. Especially with collimated sputtering technologies, this leads to surface or field thicknesses in excess of 500 Å. A 500 Å layer of Ti in the field reacts with approximately 1500 Å of Al, which increases the line resistance. The contact resistance will also increase slightly by the conversion of Ti reacting with aluminum to form $TiAl_3$ as previously described.

Thus a method to form a thin metal film in high aspect ratio features to produce an efficient substrate or wafer is desirable.

SUMMARY

One aspect of the invention is a method of filling a feature. The method comprises depositing in a single reaction chamber by a physical vapor deposition process a first layer comprising a first metal and a second metal from a composite target of the first metal and second metal and subsequently filling the feature with a conductive metal. The first layer may be deposited by sputtering using, for example, an ionized deposition process, a conventional sputtering process or a collimated sputtering process, or may be deposited by electron beam evaporation or molecular beam epitaxy. In one embodiment the first metal is titanium and the second metal is aluminum. The method is particularly applicable to filling high aspect ratio vias.

The invention is also directed to a method of forming a contact plug in a via comprising depositing a first layer comprising a first metal and a second metal deposited simultaneously from a composite target of the first metal and second metal in a single reaction chamber, and then depositing a second layer of a metal to fill the via. The first metal may be either titanium or tungsten and the second metal may be aluminum or silicon. The first metal and second metal may be deposited by sputtering the composite source, such as by ionized physical vapor deposition. The method is useful for forming a contact plug in a high aspect ratio via and can be used to deposit a film layer of different stoichiometric quantities of the first metal and the second metal to form, for example, a titanium rich bottom region of the via.

Another aspect of the invention is a method of forming a continuous film on a via or contact sidewall and bottom prior to Al fill is disclosed. The resulting film, such as a titanium aluminide ($TiAl_3$) film, provides a conformal thin seed layer for subsequent Al fill of the contact plug. The $TiAl_3$ film is thermodynamically stable in that no reaction occurs and the line resistance does not increase. Similarly, since there is no reaction in the via or contact, there is no volume reduction, thus reducing the risk of stress voiding. Additionally, the $TiAl_3$ layer still provides an advantage in preventing electromigration.

These and other aspects of the invention will be appreciated with reference to the following description of the drawings and detailed description.

DETAILED DESCRIPTION

Ionized physical vapor deposition (IPVD) as a method to deposit thin metal films on substrates such as semiconductor wafers has been described. For example, U.S. Pat. No. 5,569,363 entitled INDUCTIVELY COUPLED PLASMA SPUTTER CHAMBER WITH CONDUCTIVE MATERIAL SPUTTERING CAPABILITIES which is assigned to Sony Corporation and Materials Research Corporation, and U.S. Pat. No. 5,178,739 entitled APPARATUS FOR DEPOSITING MATERIAL INTO HIGH ASPECT RATIO HOLES, each of which is expressly incorporated by reference herein in its entirety, describe an IPVD system which may be used in the present invention to achieve high metal ionizations.

Figure 1A:
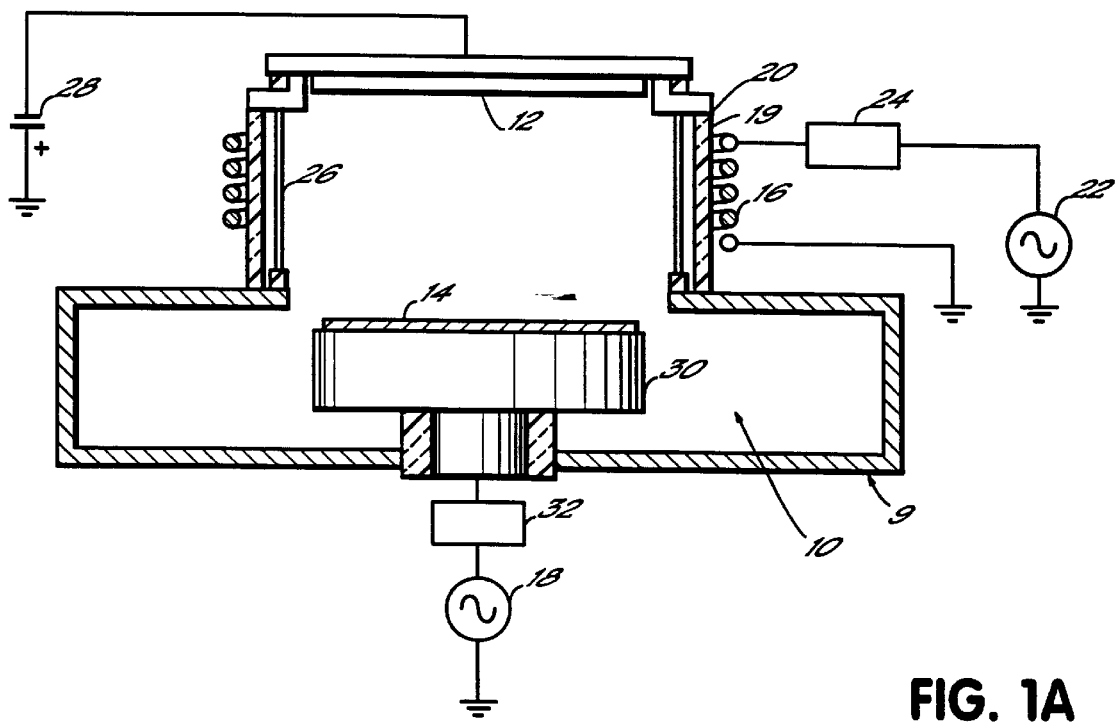
FIG. 1A is a cross-sectional view of one configuration of a reaction chamber for ionized physical vapor deposition (IPVD).
Figure 1B:
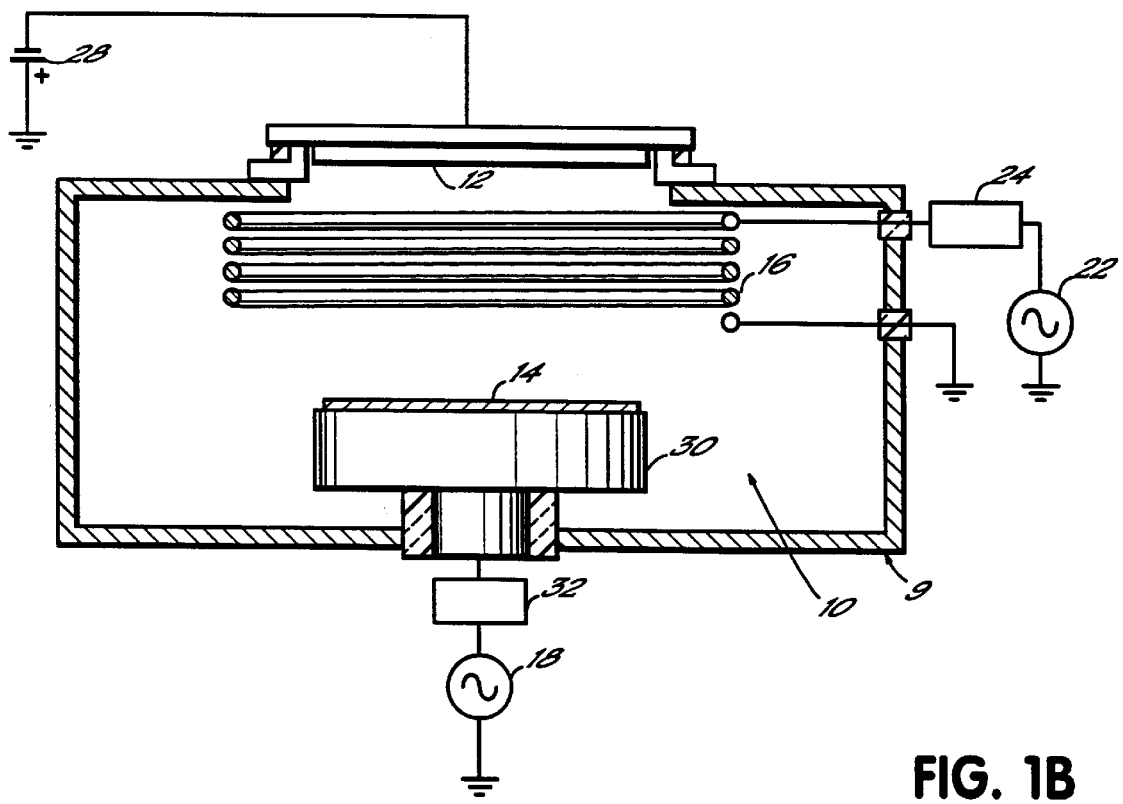
FIG. 1B is a cross-sectional view of an alternate configuration of a reaction chamber for IPVD.

With reference to FIG. 1A and FIG. 1B, a reaction chamber 9 for IPVD is shown. Materials to be deposited by IPVD are sputtered from a source or target 12. In a sputtering process, a substrate such as a semiconductor wafer 14 is mounted in a vacuum chamber reactor 9 whose interior 10 is filled with a process gas. The gas, upon electrical excitation generated by magnetic coupling of the chamber 9 to a radio frequency (Rf) powered excitation coil 16, produces a high density plasma. The plasma causes a substantial fraction of the material sputtered from the target 12 to be converted to positive ions before reaching the wafer 14.

The vacuum chamber 9 has as part of its wall 19 a dielectric material 20. As shown in FIG. 1A, the helical electrically conducting coil 16 may be disposed outside and concentric with the chamber 9. The coil 16 is energized from a supply of Rf power 22 by a suitable matching system 24. The dielectric material 20 is protected from metal deposition by an arrangement of shields 26 which are capable of passing an Rf magnetic field into the interior 10 region of the chamber 9 while excluding as much as possible such deposition of metal on the dielectric material 20 as would tend to form conducting paths for circulating currents generated by the magnetic fields. Such currents are undesirable because they lead to ohmic heating and to reduction of the magnetic coupling of the excitation coils 16 to the plasma, so that plasma densities are reduced and the process results deteriorate.

As shown in FIG. 1B, in an alternative embodiment of a reaction chamber 9 a plasma in the chamber interior 10 is generated by means of a coil 16 located in the chamber interior 10. In this alternative embodiment, neither dielectric chamber walls 20 nor special shields 26 are required. The alternative embodiment is described in U.S. Pat. No. 5,178,739 which is expressly incorporated by reference herein in its entirety.

As a result of excitation of the process gas using either embodiment of the reaction chamber 9, a high density plasma is generated in the interior 10 of the chamber 9. The high density plasma is concentrated in the region between the source 12 and the wafer 14. A negative bias on the wafer 14 causes ions to be accelerated normal to the wafer 14. The negative bias may arise either with the wafer 14 electrically isolated, such as by immersion of the wafer 14 in a plasma, or because of an applied Rf voltage from an Rf or direct current (DC) power supply 18.

The sputtering target 12 is a composite of two or more metals. In one embodiment, the target 12 is a composite TiAl$_3$ target 12 such as available in the Johnson Matthey Uniphase series. The target 12 may also contain metals other than Ti and Al, such as a composite titanium tungsten (TiW) target, titanium silicon (TiSi) target, tantulum silicon (TaSi) target, etc. Thus, while TiAl$_3$ may be used in practicing the invention, the invention is not limited to TiAl$_3$. One skilled in the art could use the disclosed principle to engineer other fill schemes. This would be based on other wetting layer materials that are thermodynamically or kinetically stable with respect to the conductor of choice, for example, Al, copper, etc. In a less preferred embodiment, more than one target is sputtered, for example, two targets may be sputtered.

The target 12 is negatively charged with respect to the plasma by means of either an Rf or DC power supply 28. The target 12 is often a planar magnetron design incorporating a magnetic circuit for plasma confinement. The sputtered material arrives at a substrate or wafer 14 supported on a susceptor 30 to which an Rf bias is applied, typically by means of an Rf power supply 18 and matching unit 32.

In a preferred embodiment of the invention, an IPVD system as previously described with a composite Ti and Al target 12 is used. The typical conditions in the interior 10 of the vacuum chamber 9 are as follows: a power generated by the DC power supply 28 to the target in the range of about 2 to about 10 kW, a power from the coils 16 in the range of about 1 to about 5 kW, a bias power from the Rf power supply 18 in the range of about 200 W to about 1000 W, that is, in the range of about −20 V to about −100 V, with −40 V most commonly used to avoid possible damage to the device, and a pressure in the interior 10 of the chamber 9 in the range of about 10 mT to about 50 mT. It should be appreciated that those skilled in the art will most likely find that operating parameters outside of the described ranges can be used to practice the invention.

The result is a conformal film that coats features such as high aspect ratio via features including deep holes and trenches. The conformal coating provides a good wetting layer or seed layer for subsequent plug fill deposition. The method obviates the need for either a post processing anneal or a high temperature deposition step of a second metal and results in increased interconnect reliability. The resulting film is thermodynamically stable with respect to the conducting metal, such as aluminum.

The invention, although not limited to IPVD and also applicable to both conventional and collimated sputtering, is advantageously coupled with a superior directional deposition to fill higher aspect ratio features which cannot be filled using more conventional sputtering techniques. However, besides a sputtering process, alternative processes such as electron beam evaporation or molecular beam epitaxy process may be used, as is known to one skilled in the art.

Figure 2:
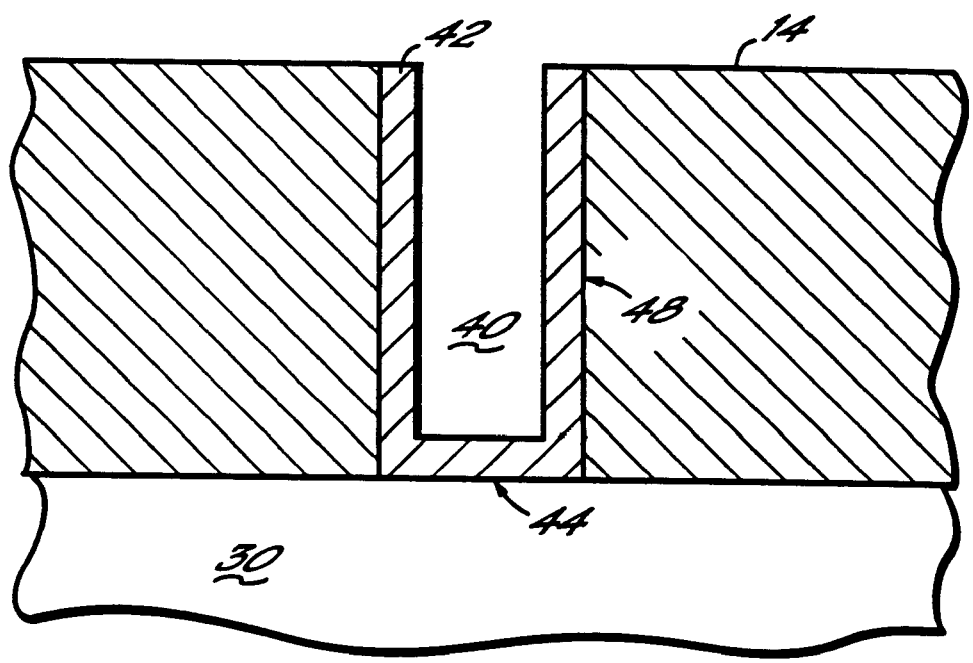
FIG. 2 is a cross sectional view of a high aspect ratio via coated with a $TiAl_3$ film.

With reference to FIG. 2, a high aspect ratio via 40 in a substrate or wafer 14 is shown. A high density plasma ionizes the metal atoms to ions, and by wafer bias accelerates ions to allow a metal film 42 to deposit by IPVD over wafer 14 topography including vias, contacts or trenches. The result is good coverage of the via bottom 44 and sidewalls 48. The via 40 thus contains a thin composite metal film 42 such as TiAl$_3$ on the bottom 44 and sidewalls 48 deposited by sputtering a composite target 12 using IPVD according to the invention.

The method of the invention has several advantages over current techniques for film deposition on wafers 14 having vias 40 with high aspect ratio structures. One advantage is that the method obviates the high temperature annealing step that is needed if Ti and Al are deposited on a wafer sequentially rather than simultaneously. Omission of the annealing step results in lower resistivity of the overall metallization structure since less Ti diffuses into the Al, and hence results in improved interconnections.

Another advantage is that the method produces a more regular morphology of the metal film 42 on the substrate 14 surface. The more regular morphology allows TiAl$_3$ to be a better wetting or seed layer, being more conducive to deposition of another barrier layer such as a layer subsequently deposited by chemical vapor deposition (CVD) or physical vapor deposition (PVD) methods.

An additional advantage of the method is that a wetting layer is deposited without a subsequent reaction. $TiAl_3$ formation is usually accompanied by a roughened interface between $TiAl_3$ and the overlying Al film. Sputtering (ionized) $TiAl_3$ should result in a smooth, continuous film that follows the contour of the high aspect ratio feature, and this microstructure should remain unchanged upon subsequent Al deposition. A smooth, continuous film provides for greater surface mobility and easier subsequent filling than a rough surface. A smooth wetting layer can impart a more desirable texture to the overlying conductor film, resulting in better electromigration properties and smoother surfaces that are easier to planarize, etch or chemical mechanical polish (CMP).

A third advantage of the disclosed method is that $TiAl_3$ may be deposited at a temperature less than about 400° C. and preferably less than about 350° C., since the material is deposited from a target 12 of the same composition. Wafer 14 temperatures greater than 400° C. have been typically used to drive the conversion of Ti and Al to form $TiAl_3$ in situ. As previously described, when Ti and Al are reacted to form $TiAl_3$, undesirable roughening of the interface between $TiAl_3$ and the overlying Al layer is observed.

Still another advantage of the disclosed method is that there is improved control over the thickness of the deposited metal layer 42. For example, forming a continuous film of Ti on a sidewall might require depositing about 500 Å on the substrate surface, with an end result of about 2000 Å of $TiAl_3$ being deposited, which is unacceptable. In contrast, forming a continuous film of $TiAl_3$ on a sidewall might require depositing only about 500 Å on the field. In the filling step (which may be either a two-step, reflow, Forcefill etc.), Al is consumed in the reaction to form $TiAl_3$. The amount of Al consumed is difficult to control, thus making it difficult to control the amount of unreacted Al remaining on the wafer 14. A two-step process might include a "cold" Al seed (defined as deposition of an Al seed layer with no back side gas and therefore no thermal connection to a support or susceptor during seed deposition) followed by a higher temperature Al fill step with back side gas present to allow the wafer to be thermally connected to the hot support.

Another advantage of the method is the ability to vary the stoichiometry of the $TiAl_3$ reaction by varying the pressure and ion energy in the interior 10 of the reaction chamber 9 during sputtering. The likely stoichiometry of titanium aluminide is $Ti_{1-3}Al_{1-3}$. Because of the different re-sputtering rates, stoichiometric $TiAl_3$ could be deposited in the bottom 44 of the via 40, with Ti rich areas deposited elsewhere. By taking advantage of increased ion densities the stoichiometry can be varied to result in, for example, titanium-rich areas at the bottom 44 of a via 40 and aluminum-rich areas elsewhere. For example, if lower resistivity is required in a certain region, more Al can be deposited. Conversely, if more of a barrier function is required in a certain region, more Ti can be deposited in that region.

Dual damascene features, whereby both contacts and lines are deposited at the same time, probably require filling of high aspect ratio features. The trend is towards more directional filling techniques such as IPVD, with Cu and Al replacing W plugs. The principle is the formation of thermodynamically (or even kinetically) stable wetting layers to allow fill of high aspect ratio contacts and vias.

A method is thus disclosed to deposit a film in a feature by depositing in one step, from a composite target 12 in a single reaction chamber 9, a uniform, continuous film 42 such as $TiAl_3$ to cover a high aspect ratio via 40. The $TiAl_3$ film 42 thus deposited provides a good wetting layer for subsequent Al contact plug fill without any Al consumption in the reaction. The film layer 42 deposited on the wafer 14 using the method of the present invention is substantially thinner than that achieved with normal fill methods. A method is also disclosed to form a contact plug in a via by simultaneously depositing a first layer of a first metal and a second metal from a composite target of the first and second metal in a single reaction chamber and then depositing a second layer of a metal to fill the via.

It should be understood that the embodiments of the present invention shown and described in the specification are only preferred embodiments of the inventor who is skilled in the art and are not limiting in any way. For example, it is possible to use operating parameters for IPVD that are outside of the disclosed ranges, or to vary the stoichiometry of the deposited film layer 42. Therefore, various changes, modifications or alterations to these embodiments may be made or resorted to without departing from the spirit of the invention and the scope of the following claims.

What is claimed is:

1. A method of depositing a film in a feature, comprising depositing into said feature in a single reaction chamber by a physical vapor deposition process a first layer comprising a first metal and a second metal from a composite target of said first metal and said second metal, wherein a stoichiometry of said first metal and said second metal reaction is varied, and subsequently filling said feature with a conductive metal.

2. The method of claim 1 wherein the depositing of the first layer is by a method selected from the group consisting of a sputtering process, an electron beam evaporation process and a molecular beam epitaxy process.

3. The method of claim 2 wherein the sputtering process is an ionized deposition process, a conventional sputtering process or a collimated sputtering process.

4. The method of claim 3 wherein two composite targets are sputtered.

5. The method of claim 1 wherein the first metal is titanium.

6. The method of claim 1 wherein the second metal is aluminum.

7. The method of claim 1 wherein the via is a high aspect ratio via.

8. The method of claim 1 wherein the reaction chamber conditions comprise a cathode power in the range of about 2 to 10 kW, a coil power in the range of about 1 to 5 kW, a bias power in the range of about 200 to 1000 W, and a pressure in the range of about 10 to 50 mT.

9. The method of claim 1 wherein said stoichiometry is varied by alteration of reaction chamber conditions.

10. The method of claim 1 wherein said film is thermodynamically stable with respect to the conducting metal.

11. A method of forming a contact plug in a via comprising depositing a first layer comprising a first metal and a second metal deposited simultaneously from a composite target of said first metal and said second metal in a single reaction chamber, wherein said first layer has different stoichiometric quantities of said first metal and said second metal, and then depositing a second layer of a metal to fill said via.

12. The method of claim 11 wherein the via is a high aspect ratio via.

13. The method of claim 11 wherein said first metal is selected from the group consisting of titanium and tungsten.

14. The method of claim 11 wherein said second metal is selected from the group consisting of aluminum and silicon.

15. The method of claim 11 wherein said first metal and said second metal are deposited by sputtering said composite target.

16. The method of claim 11 wherein said sputtering is by ionized physical vapor deposition (IPVD).

17. The method of claim 11 wherein said first layer provides a seed layer for deposition of said second layer.

18. The method of claim 11 wherein said via has a titanium rich bottom region.

19. A method of depositing a smooth continuous film in a high aspect ratio feature, comprising depositing into said feature in a single reaction chamber by a physical vapor deposition process a first layer comprising a first metal and a second metal from a composite target of said first metal and said second metal, wherein said first layer has different stoichiometric quantities of said first metal and said second metal, and subsequently filling said feature with a conductive metal, said film following a contour of said feature.

20. The method of claim 19 wherein said film provides improved surface mobility to the overlying conducting metal film.

21. The method of claim 19 wherein said film provides improved texture to the overlying conducting metal film.

22. A method of depositing a $Ti_{1-3}Al_{1-3}$ film in a feature, comprising depositing into said feature in a single reaction chamber by a physical vapor deposition process a first layer comprising titanium aluminide in varying stoichiometric quantities from a composite target of titanium and aluminum and subsequently filling said feature with a conductive metal, said film having a controlled thickness.

23. The method of claim 22 wherein said first layer comprises stoichiometric titanium aluminide ($TiAl_3$) on a bottom surface of said feature and a Ti-rich titanium aluminide on a sidewall surface of said feature.

24. The method of claim 22 wherein said first layer comprises a Ti-rich titanium aluminide on a bottom surface of said feature and an Al-rich titanium aluminide on a sidewall surface of said feature.

* * * * *